United States Patent
Bahramian et al.

(10) Patent No.: US 8,610,413 B2
(45) Date of Patent: *Dec. 17, 2013

(54) III-NITRIDE POWER CONVERTER CIRCUIT

(75) Inventors: Hamid Tony Bahramian, Torrance, CA (US); Jason Zhang, Monterey Park, CA (US); Michael A. Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 13/299,785

(22) Filed: Nov. 18, 2011

(65) Prior Publication Data
US 2012/0062199 A1 Mar. 15, 2012

Related U.S. Application Data

(63) Continuation of application No. 12/008,629, filed on Jan. 11, 2008, now Pat. No. 8,063,616.

(51) Int. Cl.
*H02M 1/08* (2006.01)
*H03K 17/04* (2006.01)

(52) U.S. Cl.
USPC .......................................... 323/271; 323/312

(58) Field of Classification Search
USPC ................ 323/312–314, 269–272; 327/333, 327/538–543; 326/62
See application file for complete search history.

(56) References Cited

U.S. PATENT DOCUMENTS

| | | | | |
|---|---|---|---|---|
| 4,704,563 A | * | 11/1987 | Hussey | 315/307 |
| 5,649,466 A | * | 7/1997 | Genovese | 89/1.11 |
| 7,116,136 B2 | * | 10/2006 | Honda et al. | 327/108 |
| 7,382,001 B2 | * | 6/2008 | Beach | 257/194 |
| 7,863,877 B2 | | 1/2011 | Briere | |
| 8,063,616 B2 | * | 11/2011 | Bahramian et al. | 323/271 |
| 2005/0110559 A1 | * | 5/2005 | Farkas et al. | 327/536 |

FOREIGN PATENT DOCUMENTS

| | | |
|---|---|---|
| JP | 4-233824 | 8/1992 |
| JP | 2007-6658 | 1/2007 |

* cited by examiner

*Primary Examiner* — Jessica Han
(74) *Attorney, Agent, or Firm* — Farjami & Farjami LLP

(57) ABSTRACT

An integrated circuit that includes a power stage and a driver stage, all stages using III-nitride power devices.

11 Claims, 4 Drawing Sheets

| PWM | 44, 60 | 44', 60' | 44", 60" | 40, 66 | 30, 50 | 32, 52 | 16, 18 |
|---|---|---|---|---|---|---|---|
| HI | ON | OFF | ON | OFF | ON | OFF | ON |
| HI | ON | OFF | ON | OFF | OFF | ON | OFF |
| LO | OFF | ON | OFF | ON | OFF | ON | OFF |
| LO | OFF | ON | OFF | ON | ON | OFF | ON |

Fig. 4

III-NITRIDE POWER CONVERTER CIRCUIT

This is a continuation of application Ser. No. 12/008,629 filed Jan. 11, 2008 now U.S. Pat. No. 8,063,616.

DEFINITION

III-nitride switch (or occasionally device) as called for herein refers to heterojunction type power semiconductor devices such as a high electron mobility transistor (HEMT) that use alloys from the InAlGaN system such as GaN, AlGaN, InGaN, AlN or the like.

BACKGROUND AND SUMMARY OF THE INVENTION

The present invention relates to an integrated circuit for power conversion, and more specifically to an integrated circuit for power conversion that uses III-nitride power semiconductor switches in the power conversion stage as well as the driver stage thereof.

III-nitride heterojunction power semiconductor switches are known. For example, Khan et al., U.S. Pat. No. 5,192,987, discloses one type of depletion mode III-nitride HEMT, while Beach, U.S. Pat. Pub. 2006/0060871 discloses examples of several types of enhancement mode III-nitride HEMTS.

III-nitride switches are particularly desirable for power applications because of the relatively higher band gap of the III-nitride material, the relatively low resistivity of the switch during conduction, and high frequency switching abilities.

It is an object of the present invention to provide an integrated circuit for power conversion in which the switches in the power stage as well as the switches in the driver stage are III-nitride switches.

An integrated circuit according to the present invention includes a power conversion bridge between a bus voltage and ground, and including a switched node for supplying current to an output circuit, and a driver stage that includes a first section and a second section, the first section being between a negative supply voltage and ground, and the second section being between the switched node and a derived voltage below the switched node derived from the negative supply voltage.

In one embodiment, the power conversion bridge includes a high side III-nitride switch and a low side III-nitride switch series connected with the high side III-nitride switch to form a half-bridge. In the preferred embodiment, the first and the second III-nitride switches are depletion mode devices. Moreover, in the preferred embodiment, the first section and the second section each includes a driver bridge comprised of two series connected III-nitride switches in a half-bridge arrangement having an output thereof coupled to a respective gate of one of the high side III-nitride switch and the III-nitride low side switch. In one embodiment, the series connected III-nitride switches in each the first section and the second section are enhancement mode devices. In another embodiment, the series connected III-nitride switches in each the first section and the second section are depletion mode devices.

Disclosed herein is also a novel level shifting scheme for level shifting a PWM signal before it is supplied to the drive stage.

Other features and advantages of the present invention will become apparent from the following description of the invention which refers to the accompanying drawings.

BRIEF DESCRIPTION OF THE DRAWINGS

FIG. 4 sets forth events at the gates of the various switches in the first embodiment of the present invention in response to a PWM signal.

DETAILED DESCRIPTION OF EMBODIMENTS

Figure 1:
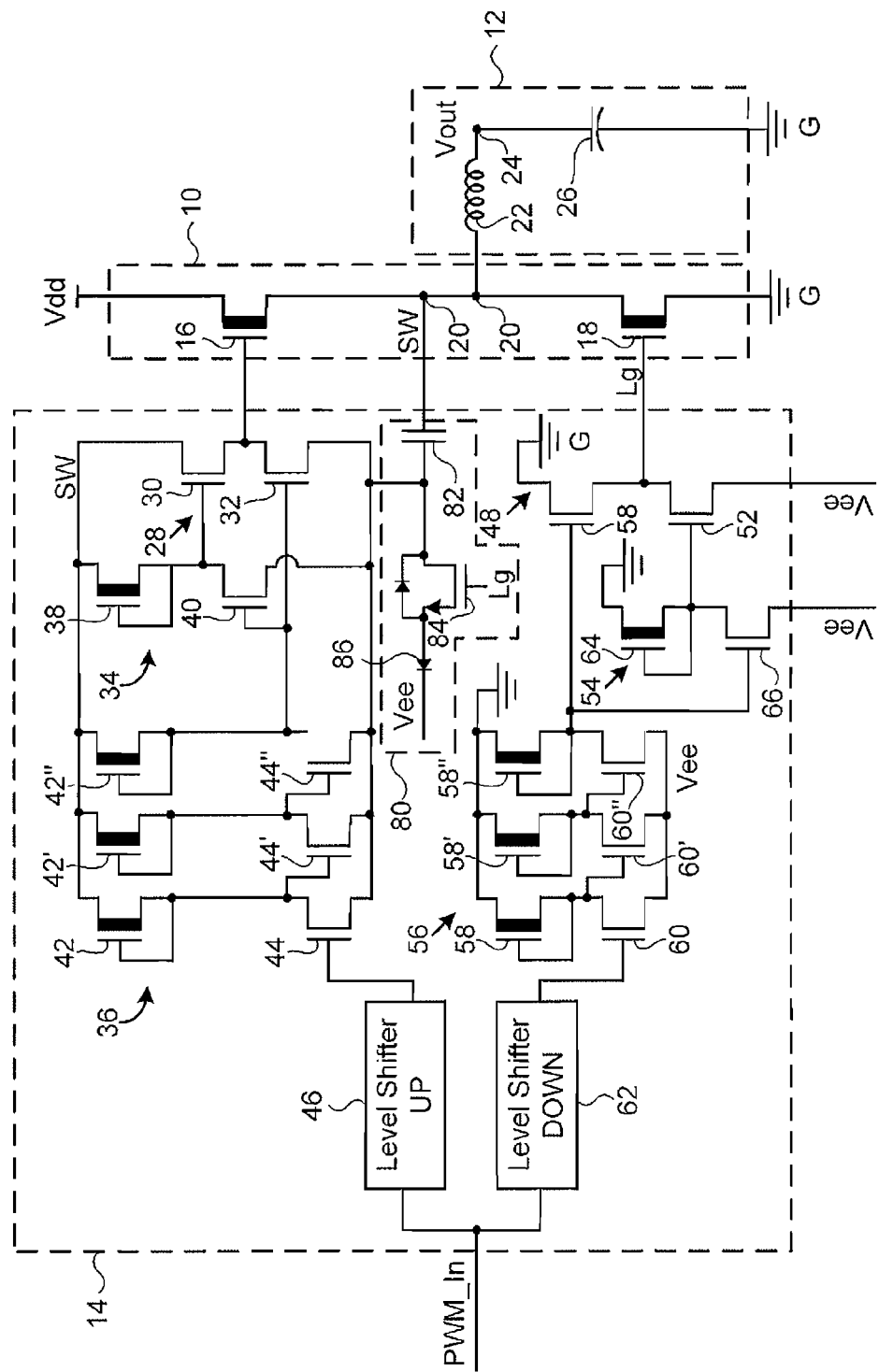
FIG. 1 illustrates a circuit diagram of an integrated circuit according to a first embodiment.

Referring to FIG. 1, a power converter according to the preferred embodiment of the present invention includes a power conversion stage 10, an output stage 12, and a driver stage 14. Power conversion stage 10 includes a high side III-nitride depletion mode switch 16 and a low side III-nitride depletion mode switch 18 series connected with high side switch 16 in a half-bridge arrangement between an input voltage source (bus voltage) Vdd and ground G. Note that the output 20 of power conversion stage 10, i.e. the switched node 20, is coupled to output stage 12. Specifically, output stage 12 includes an inductor 22 series connected between power output node 24 and switched node 20 and output capacitor 26 coupled between power output node 24 and ground G.

Driver stage 14 includes a high side driver for providing gate signals to high side switch 16 and a low side driver for providing gate signals to low side switch 18. The high side driver includes a high side driver bridge 28. High side driver bridge 28 includes a first III-nitride enhancement mode switch 20 series connected with a second III-nitride enhancement mode switch 32. Note that the output of high side bridge 28 provides gate signals to the gate of high side switch 16. The high side driver further includes a first predriver 34 for providing gate signals to first switch 30, and a second predriver 36 for providing gate signals to second switch 32. First predriver 34 includes a III-nitride depletion mode switch 38 that is series connected to form a bridge with an enhancement mode III-nitride switch 40. Note that first predriver 34 is coupled between the voltage of the switched node 20 on a bootstrap voltage, as explained later. Second predriver 36 includes three parallel connected bridges each including a depletion mode III-nitride switch 42, 42', 42" series connected with a respective enhancement mode III-nitride switch 44, 44', 44". Driver 14 further includes an up level shifter 46 which shifts a PWM (pulse width modulated) signal from an external PWM source and supplies the same to the gate of switch 44.

The low side driver includes a low side driver bridge 48. Low side driver bridge 48 includes third enhancement mode III-nitride switch 50 which is series connected with a fourth enhancement mode III-nitride switch 52 to form a bridge connected between ground G and negative rail Vee. A third predriver 56 provides a gate signal to the gate of third switch 50, while a fourth predriver 54 provides a gate signal to the gate of fourth switch 52. Third predriver 56 includes three parallel connected bridges each including a depletion mode III-nitride switch 58, 58', 58" series connected with a respective enhancement mode III-nitride switch 60, 60', 60" to form a bridge connected between Vee and ground G. Note that switch 60 receives a level shifted gate signal from a down level shifter 62 which shifts a PWM signal from an external source. Fourth predriver 54 includes a depletion mode III-nitride switch 64 series connected with an enhancement mode III-nitride switch 66 to form a bridge that is connected between ground and Vee.

Thus, according to one aspect of the present invention only one negative rail Vee is required for a gate driver according to the preferred embodiment.

Figure 2:
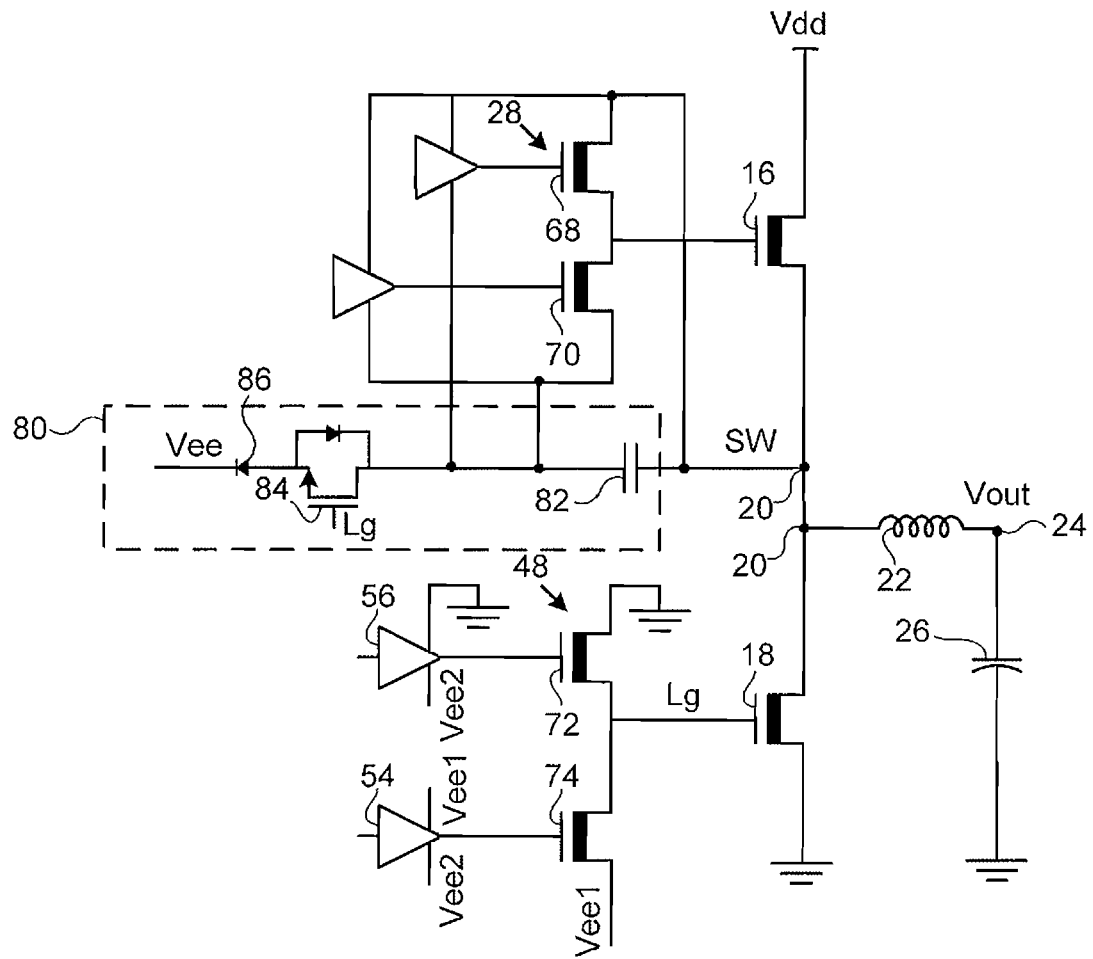
FIG. 2 illustrates a circuit diagram of an integrated circuit according to a second embodiment.

Referring now to FIG. 2, in an alternative embodiment, high side driver bridge 28 includes two depletion mode III-nitride switches 68, 70 connected in series, while low side driver bridge 48 includes two depletion mode III-nitride switches 72, 74. Note that in an arrangement according to the second embodiment two negative rail voltage Vee1 and Vee2 are used to supply power to the predrivers. Specifically, while low side driver bridge is coupled between Vee1 and ground, fourth predriver is coupled between Vee2 and Vee1, while third predriver is coupled between Vee2 and ground. Note that Vee1 is higher than Vee2.

Figure 3A:
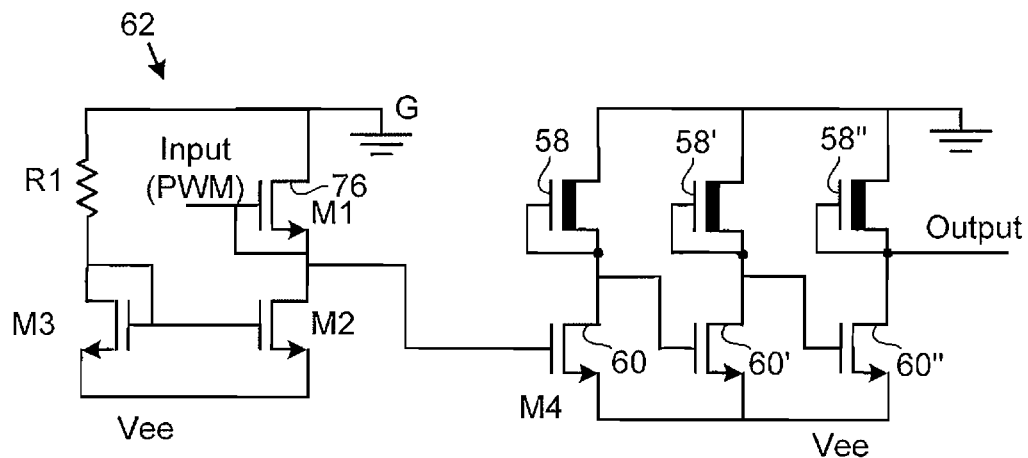
FIG. 3A illustrates a circuit diagram for a down level shifter according to one aspect of the present invention.

Referring now to FIG. 3A, according to one aspect of the present invention down level shifter 62 includes enhancement mode III-nitride switches M1 and M2 which are series connected to form a bridge 76 between ground G and Vee. Note that the gate of switch M1 is shorted to the output node of bridge 76 and receives an input signal from an external PWM source. Down level shifter 62 further includes a resistor R1 series connected with an enhancement mode III-nitride switch between ground G and Vee. Note that the gates of switches M2 and M3 are shorted to one another and shorted between drain of switch M3 and resistor R1. Down level shifter 62 is coupled between ground and Vee.

The level shift circuit uses switch M1 to shift the input voltage (FIG. 2). The output of level shifter 62 drives the gate of switch 60. Switch M1 has a threshold voltage $V_{t1}$. Switch M2 has a threshold voltage $V_{t2}$, which is less than $V_{t1}$ ($V_{t2}<V_{t1}$). This enables larger level shifting. Also switch 60 has threshold voltage $V_{t1}$, which enables it to be turned off to provide proper signal to the following stages.

Note that each embodiment may also include a bootstrap arrangement 80. Bootstrap arrangement 80 includes bootstrap capacitor 82, a transistor 84, a diode 86 connected between switched node 20 and Vee. Transistor 84 turns on/off together with low side switch 18 to charge up bootstrap capacitor 82 whenever the voltage at switched node 20 is low. Note that bootstrap arrangement 80 in the embodiment shown by FIG. 2 is coupled to Vee1.

An arrangement according to the present invention operates as follows. When a PWM signal is received it is level shifted up by level shifter 46, and the level shifted signal is amplified by predriver bridges 36. Predriver 34 then drives switch 30 in driver bridge 28 in order to send a gate signal to high side switch 16.

The low side operation is similar. Specifically, a PWM signal is level shifted down by level shifter 62, and the level shifted signal is amplified by predriver bridges 56. Predriver bridge 54 then drives switch 52, which in turn allows for a gate signal to be provided to low side switch 18.

In an arrangement according to the present invention, dead-time control scheme can be greatly simplified, and can be implemented with a few delay gates, due to minimal propagation delays.

Referring now to FIG. 1 and FIG. 4, a drive arrangement according to the present invention operates as follows. First, it should be noted that as set forth in FIG. 4, with respect to depletion mode devices, ON means that there is no gate charge being applied. Consequently, the device is conducting. Conversely, OFF with respect to depletion mode devices means that there is a gate charge, which means the device is not conducting; i.e., the device is OFF. On the other hand, with respect to enhancement mode devices, the term OFF means that there is no gate charge, which means the devices are not conducting, and the term ON means there is gate charge present, and thus the device is conducting.

Note that the second and the fourth rows relate to the charge on the gates of devices on the high side, namely 44, 44', 44", 40, 30, 32 and 16, while the third and the fifth rows relate to the charge on gates of the devices on the low side namely devices 60, 60', 60", 66, 50, 52 and 18.

Thus, as illustrated when the PWM signal is high the high side switch is ON, which means there is no gate charge supplied to the gate of switch 16. Specifically, the bootstrap capacitor shifts the negative rail of the driver bridge to a voltage below the voltage of switched node 20. Thus, when level shifter 46 sends a signal to the gate of switch 44 which turns the same ON, the gate of switch 44' is shifted low, while the gate of switch 44" is shifted to the switched node which turns the same ON. As a result, the gate of switch 32' and switch 40 are biased to the voltage of the bootstrap capacitor, which keeps switches 32' and 40, OFF resulting in the charging of the gate of switch 30 to turn the same ON. Consequently, no negative gate charge is applied to the gate of high side switch 16 leaving the same ON.

On the other hand, when PWM signal is high, the gate of switch 60 is charged, which results in the shifting of the gate of switch 60' low, and shifting of the gate of switch 60" high. As a result, the gate of switch 66 is shifted low, which keeps the same OFF, resulting in the charging of the gate of switch 52. Thus, the gate of low side switch is charged with Vee, which turns the same OFF. Note that the gate of switch 50 is not charged due to the fact that switch 60" is ON.

When the PWM signal is low, high side switch 16 must be turned OFF, which means that the gate of switch 16 must be biased with a negative bias. Therefore, the gate of switch 32 must be charged in order to bias the gate of switch 16 to bootstrap voltage. Thus, when PWM signal is low, the gate of switch 44 is not charged. Consequently, the gate of switch 44' is charged turning the same ON, while shifting the gate of switch 44" low to turn the same OFF. As a result, the gate of switch 40 is charged, which in turn shifts the gate of switch 30 low. However, because the gate of switch 44" is OFF, the gate of switch 32 is charged rendering switch 32 ON, and biasing the gate of high side switch 16 to the negative bootstrap voltage and turning the same OFF.

When PWM signal is low, low side switch 18 should conduct which means there will be no gate charge supplied to the gate of the same. Thus, switch 52 is OFF while switch 50 is ON. Specifically, when PWM signal is low the gate of switch 60 is not charged leaving the same OFF, which results in the charging of the gate of switch 60', to turn the same ON. As a result, the gate of switch 60" will be biased to Vee and, therefore, switch 60" will remain OFF. Consequently, the gate of switch 66 will be charged to turn the same ON and bias the gate of switch 52 with a negative bias to turn the same OFF. However, because switch 66" is OFF the gate of switch 50 is charged which will not charge the gate of low side switch 18 leaving the same ON in response to the low PWM signal.

Referring to FIG. 3A, down level shifter 62 operates as follows. When PWM signal is high the gate of switch M1 is shifted high. As a result, the gate of switch 60 is shifted to ground which turns switch 60 ON. On the other hand, when PWM signal is low, resistor R1 shifts the gates of switches M2 and M3 high, which in turn shifts the gate of switch 60 to Vee to turn the same off.

Figure 3B:
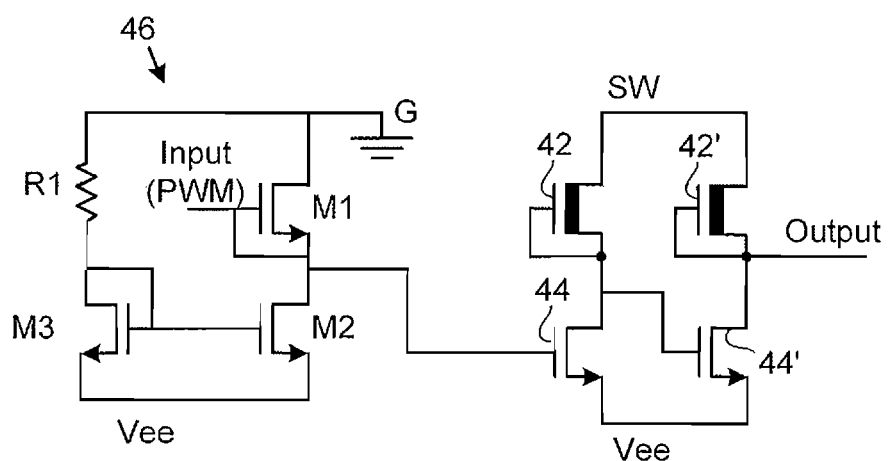
FIG. 3B illustrates a circuit diagram for an up level shifter according to another aspect of the present invention.

Referring to FIG. 3B, in which like numerals identify like features, up level shifter 46 essentially operates in the same manner as down level shifter 62. However, the output of up level shifter 46 is coupled to the gate of switch 44, which coupled between Vee and SW. Thus, the output of up level shifter 46 is level shifted down first and then level shifted up because of the bridges between Vee and SW.

An integrated circuit according to the present invention enables high frequency operation in such applications as DC-DC conversion. Also, preferably the PWM signals are provided by an external IC. Advantageously, due to the ultra high speed of an integrated circuit according to the present invention (i.e. sub nano second) the need for explicit dead-time control may be removed or simplified. Also, drive symmetry may enable precise dead-time matching for the power devices. Furthermore, although the power switches in the preferred embodiments are depletion mode, it should be appreciated that enhancement mode switches may be used without deviating from the scope and spirit of the present invention. Moreover, the pre-drive stage using enhancement mode switches in the first embodiment enables operation using only one negative voltage rail, and the availability of multiple threshold voltage switches enables improved performance. Due to the depletion-mode nature of the power switch, a (one or multiple) disable switch can be implemented for start-up situations. Advantageously, an integrated circuit according to the present invention, enables ultra high-frequency operation, reducing the size of the output inductor and capacitor, and allowing very high power densities along with reduced space for the power management unit.

An integrated circuit can be realized in a single die as opposed to using discrete, individual die. Thus, the low side and high side switches in the power stage, the switches in the driver stage, the level shifters and all logic circuit are integrated in a single die.

Furthermore, although an integrated circuit is preferred for a DC-DC converter application such as a buck converter, the same topology can be applied to boost converters, other half-bridge applications, three phase motor drivers, and the like applications.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power converter comprising: a power conversion stage between a bus DC voltage and a ground, said power conversion stage including a switched node for supplying current to an output stage; a driver stage configured to drive said power conversion stage, said driver stage including a first section and a second section, said first section being between a negative supply voltage and ground, and said second section being between said switched node and a derived voltage below said switched node; said output stage generating an output DC voltage of said power converter, wherein said output DC voltage of said power converter is below said bus DC voltage, said power converter being thereby utilized as a buck converter.

2. The power converter of claim 1, wherein said output stage comprises at least one inductor coupled between said switched node and an output node of said power converter to provide said output DC voltage of said power converter at said output node of said power converter.

3. The power converter of claim 2, wherein an output capacitor is coupled between said output node and said ground.

4. The power converter of claim 1, wherein said power conversion stage includes a low side III-nitride switch connected with a high side III-nitride switch to form a half-bridge.

5. The power converter of claim 4, wherein said high side III-nitride switch and said low side III-nitride switch are depletion mode devices.

6. The power converter of claim 1, wherein said first section and said second section each includes a driver bridge comprised of two III-nitride switches in a half-bridge arrangement having an output thereof coupled to a respective gate of one of said high side III-nitride switch and said III-nitride low side switch.

7. The power converter of claim 6, wherein said III-nitride switches in each said first section and said second section are enhancement mode devices.

8. The power converter of claim 6, wherein said III-nitride switches in each said first section and said second section are depletion mode devices.

9. The power converter of claim 6, wherein each said first and said second section includes a logic circuit comprising of a plurality of parallel connected bridges, each bridge including an enhancement mode III-nitride switch and a depletion mode III-nitride switch.

10. The power converter of claim 9, wherein said parallel connected bridges serve to selectively operate one of said two III-nitride switches in said driver bridge based on an externally supplied PWM signal.

11. The power converter of claim 1, further comprising a boot strap arrangement to derive said derived voltage.

\* \* \* \* \*